(12) United States Patent
Kim et al.

(10) Patent No.: US 6,335,881 B2
(45) Date of Patent: Jan. 1, 2002

(54) METHOD FOR PROGRAMMING A FLASH MEMORY DEVICE

(75) Inventors: Jong-Hwa Kim; Eun-Cheol Kim, both of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/781,932

(22) Filed: Feb. 12, 2001

(30) Foreign Application Priority Data

Feb. 11, 2000 (KR) .............................................. 00-6443

(51) Int. Cl.[7] .............................................. G11C 16/04
(52) U.S. Cl. ............................ 365/185.18; 365/185.17; 365/185.33
(58) Field of Search ....................... 365/185.18, 185.17, 365/185.12, 185.33

(56) References Cited

U.S. PATENT DOCUMENTS 5,953,251 A * 9/1999 Caravella ............... 365/185.18

* cited by examiner

Primary Examiner—David Nelms
Assistant Examiner—David Lam
(74) Attorney, Agent, or Firm—Marger Johnson & McCollom, P.C.

(57) ABSTRACT

The method for programming a flash memory device includes sequentially loading program data in the page buffer circuit responsive to a first command signal, the first command signal indicating program data input and generating a program voltage responsive to a second command signal, the second command signal indicating programming initiation. EEPROM cells are programmed after the program voltage reaches a predetermined target. All of the programmed EEPROM cells are verified to ensure that they are properly programmed. If the EEPROM cells are not properly programmed, programming is repeated until all of the EEPROM cells are properly programmed. The program voltage is increased in a stepwise manner every time programming is repeated.

7 Claims, 4 Drawing Sheets

METHOD FOR PROGRAMMING A FLASH MEMORY DEVICE

This application claims priority from Korean Patent Application No. 2000-06443, filed on Feb. 11, 2000, the contents of which are herein incorporated by reference in their entirety.

FIELD OF THE INVENTION

The present invention relates to a semiconductor device and, more particularly, to a method for programming a nonvolatile semiconductor memory device to improve its program time.

BACKGROUND OF THE INVENTION

Recently, demand for semiconductor memory devices that are electrically programmed and erased without refreshing data stored in the memory devices has increased. Also, it is a main trend to increase storage capacity and integration density of semiconductor memory devices thereof. A NAND-type flash memory device, for example, is a nonvolatile semiconductor memory device for providing large capacity and high integration density without refreshing stored data. Since the nonvolatile semiconductor memory devices maintain their data at power-off, they are widely used in applications where power can be suddenly interrupted.

A NAND-type flash memory device is a nonvolatile semiconductor memory device includes electrically erasable programmable read-only memory (EEPROM) cells, which are often referred to as "flash EEPROM cells". The flash EEPROM cell comprises a cell transistor, which has a semiconductor substrate (or bulk) of a first conductivity type (e.g., P-type), spaced source and drain regions of a second conductivity type (e.g., N-type), a floating gate placed over a channel region between the source and drain regions for storing charges, and a control gate placed over the floating gate.

As well known to those skilled in the art, the NAND-type flash memory device comprises an array of NAND-structured EEPROM cells. A cross-sectional diagram of the array is illustrated in some detail in "Semiconductor Memories: A Handbook of Design, Manufacture, and Application" by Betty Prince, $2_{nd}$ Ed., John Willey & Sons, pp. 698–717 (1991), which is hereby incorporated by reference.

The flash EEPROM cell transistor is programmed or erased by the so-called F-N tunneling mechanism. A rough description of the mechanism is as follows. A cell transistor is erased carried out by applying a ground voltage (0V) to its control gate and a voltage (e.g., 20V), higher than a power supply voltage, to its bulk or substrate. This large voltage difference sets up a strong electric field between the floating gate and the bulk such that electrons on the floating gate are discharged into the bulk. The effect is termed F-N tunneling. A threshold voltage of erased cell transistor shifts into a negative direction (e.g., −3V). This state is defined as data "1" and a flash EEPROM cell having the data "1" a state is called an "on-cell".

In order to program the cell transistor, a voltage (e.g., 18V) higher than the power supply voltage is applied to its control gate and a ground voltage is applied to its drain and bulk. Under this bias condition, electrons are injected in the floating gate of the cell transistor by the F-N tunneling effect. The threshold voltage of the programmed memory cell shifts into a positive direction (e.g., 1V). This state is defined as data "0" and a flash EEPROM cell having the data "0" a state is called an "off-cell".

A detailed description of the program operation is as follow. First, a command (e.g., '80'h) indicating a sequential data input is provided to a flash memory device having the array of programmed memory cells. An address and data are then sequentially provided to an address buffer circuit and a page buffer circuit. After a data input, a high voltage generating circuit generates a high control gate voltage responsive to a command (e.g., '10'h) indicating the start of programming. At the same time, bit lines are set with a power supply voltage (or a program inhibition voltage) or a ground voltage (or a program voltage) according to data loaded in the page buffer circuit. This operation is called "a bit line setup operation". After the bit line setup operation, the high voltage from the high voltage generating circuit is supplied to a selected word line. This last operation is called "a program operation". After a predetermined time elapses under the bias condition of the program operation, data from selected cell transistors is read. This operation is called "a verify operation". If at least one of the selected cell transistors is insufficiently programmed, the above-described programming process, which consists of a subset of the bit line setup operation, the program operation, and the verify operation, is repeated by predetermined number of program loops. with each program loop, the high voltage is increased.

A technique for increasing the high voltage at each program loop iteration is disclosed in IEEE International Solid-State Circuits Conference, 1995, pp.128–129, "A 3.3V 32Mb NAND Flash Memory with Incremental Step Pulse Programming Scheme," by Suh, Kang-Deog et al., which is hereby incorporated by reference.

A problem arises when the above-mentioned program method is applied to the NAND-type flash memory device. This problem involves carrying out the program operation before the high voltage reaches a required voltage level. Causing the first program loop to fail. If the first program loop fails, the number of program loops consequently increases thereby increasing program time. Also, a flash EEPROM cell transistor to be programmed at the first program loop is over-programmed at the following program loop due to the initial program fail are because the high voltage applied to a selected word line is increased by a predetermined voltage (e.g., 0.4V) at the following program loop. The result is that operating characteristics of programmed cell transistors are adversely affected.

SUMMARY OF THE INVENTION

It is therefore an object of the present invention to provide a flash memory device capable of overcoming the disadvantages and problems associated with prior art flash memory devices. It is another object of the present invention to provide a flash memory device capable of reducing program time.

It is but another object of the present invention to provide a method of programming a flash memory device, that is capable of preventing characteristic of an EEPROM cell degradation.

In order to provide this and other objects, advantages and features according to the present invention, a method of programming a a nonvolatile semiconductor memory device is provided. The nonvolatile semiconductor memory device includes an array of electrically erasable and programmable read-only memory cells (EEPROMs) arranged in a matrix of rows and columns and a page buffer circuit coupled to the array via the columns. The method comprises sequentially loading program data in the page buffer circuit responsive to a first command signal, the first command signal indicating program data input and generating a program voltage responsive to a second command signal, the second command signal indicating programming initiation. EEPROM cells are programmed after the program voltage reaches a predetermined target. Programming the EEPROM cells includes charging the columns with either a program-inhibit voltage or a column program voltage depending on the program data, supplying the program voltage to a selected row to thereby program the EEPROM cells on the selected row, and discharging the rows and columns after charging and supplying. Data is read out from the programmed EEPROM cells after discharging. All of the programmed EEPROM cells are verified to ensure that they are properly programmed. If the EEPROM cells are not properly programmed, programming is repeated until all of the EEPROM cells are properly programmed. After each programming iteration, the program voltage is increased in a stepwise manner.

BRIEF DESCRIPTION OF THE DRAWINGS

A more complete appreciation of the present invention, and many of the attendant advantages thereof, will become readily apparent as the same becomes better understood by reference to the following detailed description when considered in conduction with the accompanying drawings in which like reference symbols indicate the same or similar components.

DESCRIPTION OF THE PREFERRED EMBODIMENT

The preferred embodiment of the invention will be more fully described with reference to the attached drawings.

According to a novel program algorithm of the present invention, a high voltage generating circuit operates responsive to a command indicating the beginning of a programming process. After the high voltage generating circuit produces a high voltage of a required level, the programming process, which consists of a subset of the bit line setup operation, the program operation, and the verify operation described earlier, is repeated by the number of predetermined program loops. Since the program operation is carried out using a high voltage sufficient to program a memory cell, this program algorithm solves problems associated with a conventional program method.

Figure 1:
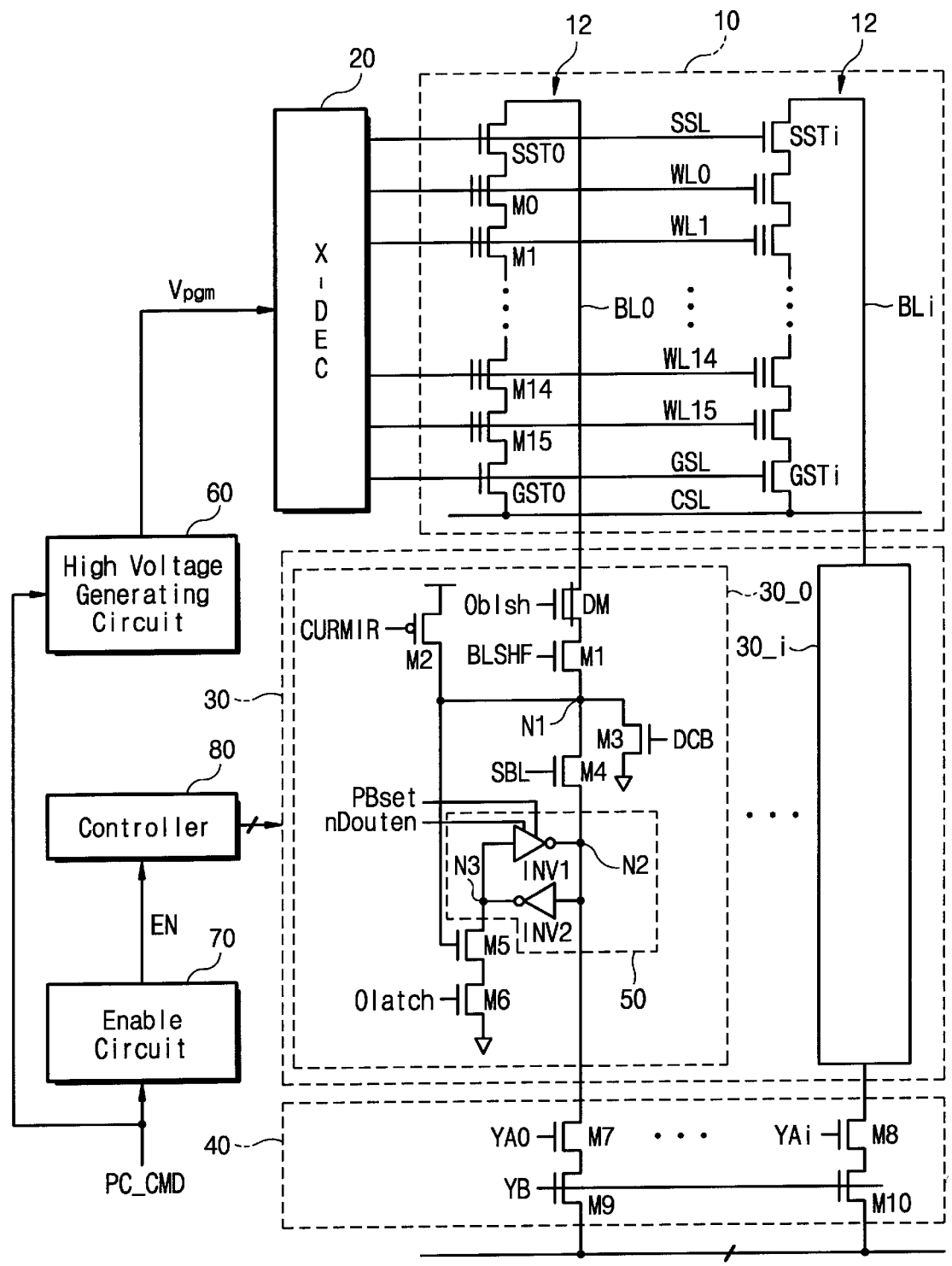
FIG. 1 is a block diagram showing a flash memory device according to the present invention.

A block diagram showing a NAND-type flash memory device according to the present invention is illustrated in FIG. 1. The flash memory device comprises a cell array 10, a row decoder circuit (X-DEC) 20, a page buffer circuit 30, and a column pass gate circuit 40. The cell array 10 has a plurality of strings 12 arranged along columns. One string, such as string 12, is a cell unit corresponding to 1-bit data. Each string comprises a string select transistor SST m (m=0, 1, 2, . . ., i) whose gate is connected to a string select line SSL. Each string further comprises a ground select transistor GSTm whose gate is connected to a ground select line GSL. In each string, a plurality of memory cells Mn (n=0, 1, 2, . . . , 15) are connected in series between a source of the string select transistor SSTm and a drain of the ground select transistor GSTm. Control gates of memory cells in each string are connected to corresponding word lines WL0 to WL15. The drain of each string select transistor SSTm is connected to a corresponding bit line BLm, and the source of each ground select transistor GSTm is connected to a common source line CSL. The string select line SSL, the word lines WL0 to WL15 and the ground select line GSL are electrically connected to the row decoder X-DEC 20.

The page buffer circuit 30 comprises a plurality of page buffers 30—0 to 30—i corresponding to the bit lines BL0 to BLi, respectively. During a read cycle, each page buffer 30_0 to 30_i senses data from a selected memory cell, and transfers the sensed data to a data output buffer (not illustrated) through the column pass gate circuit 40. During a write cycle, each page buffer stores data applied from an input/output buffer through the column pass gate circuit 40. Circuit construction and function will be described with reference to one page buffer 30_0 corresponding to the bit line BL0. Other page buffers 30_1 to 30_i corresponding to other bit lines BL1 to Bli, respectively, have the same circuit construction and function as the page buffer 30_0.

The page buffer 30_0 comprises a PMOS transistor M2, five NMOS transistors M1 and M3 to M6, and a latch 50 consisting of two inverters INV1 and INV2. The NMOS transistor M1, whose gate is connected to receive a signal BLSHF, is connected between a node N1 and the bit line BL0 through a depletion-type MOS transistor DM. The NMOS transistor M1 is used to adjust the voltage level of the bit line BL0 and to prevent the page buffer 30_0 from being affected by a high voltage spike. The gate of the depletion-type MOS transistor DM is connected to receive a signal Oblsh. The source and drain of the PMOS transistor M2, whose drain is connected to the node N1 (or the drain of the transistor M1), are connected to a signal CURMIR and a power supply voltage Vcc, respectively. The PMOS transistor M2 supplies current to the bit line BL0 in response to the signal CURMIR. The NMOS transistor M3, whose gate is connected to receive a signal DCB, is connected between the node N1 and the ground voltage. The NMOS transistor M3 pulls down a voltage of the bit line BL0, and initializes the page buffer (i.e., the latch 50) with a ground voltage level. The NMOS transistor M4, whose gate is connected to receive a signal SBL, is connected between a node N2 and the node N1. A node N3 of the latch 50 (a complementary node of the node N2) is connected to the ground voltage Vss through the NMOS transistors M5 and M6. The gate of the transistor M5 is connected to the node N1, and the gate of the transistor M6 is connected to receive a signal Olatch. The NMOS transistors M5 and M6 change a state of data stored in the latch 50 in response to a voltage level on the bit line BL0 and the signal Olatch.

The flash memory device according to the present invention further comprises a high voltage generating circuit 60, an enable circuit 70 and a controller 80. The high voltage generating circuit 60 performs a pump operation in response to a program confirm command signal PC_CMD to thereby generate a high voltage $V_{PGM}$ of a required level. The enable circuit 70 generates an enable pulse signal EN in response to the program confirm command signal PC_CMD. The controller 80 controls an operation of the page buffer circuit 30 according to a programming process in response to the enable signal EN. That is, the controller 80 controls logic levels of control signals used in the page buffer 30 according to the programming process. After the high voltage generating circuit 60 sufficiently generates a high voltage $V_{PGM}$ of a required level, the enable signal EN is pulsed, as will be described more fully below.

Figure 2:
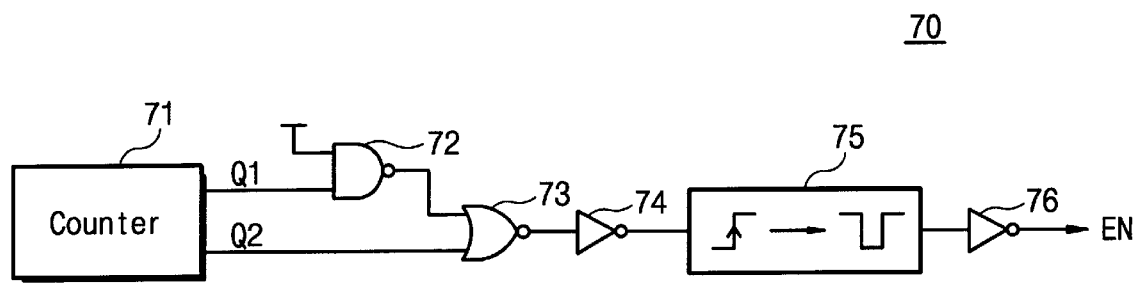
FIG. 2 is a preferred embodiment of the enable circuit shown in FIG. 1.

Referring to FIG. 2 which shows a preferred embodiment of the enable circuit 70. The circuit 70 comprises a counter 71, a NAND gate 72, a NOR gate 73, inverters 74 and 76, and a pulse generator 75, which are connected as illustrated in FIG. 2. The counter 71 generates signals Q1 and Q2 when the program confirm command signal PC_CMD is inputted the signal Q1 having a period different from a period of the Q2 signal. The enable signal EN is generated not when the program confirm command signal PC_CMD is inputted, but rather after the command signal PC_CMD is inputted and a time sufficient to generate a high voltage $V_{PGM}$ of a required level elapses.

Figure 3:
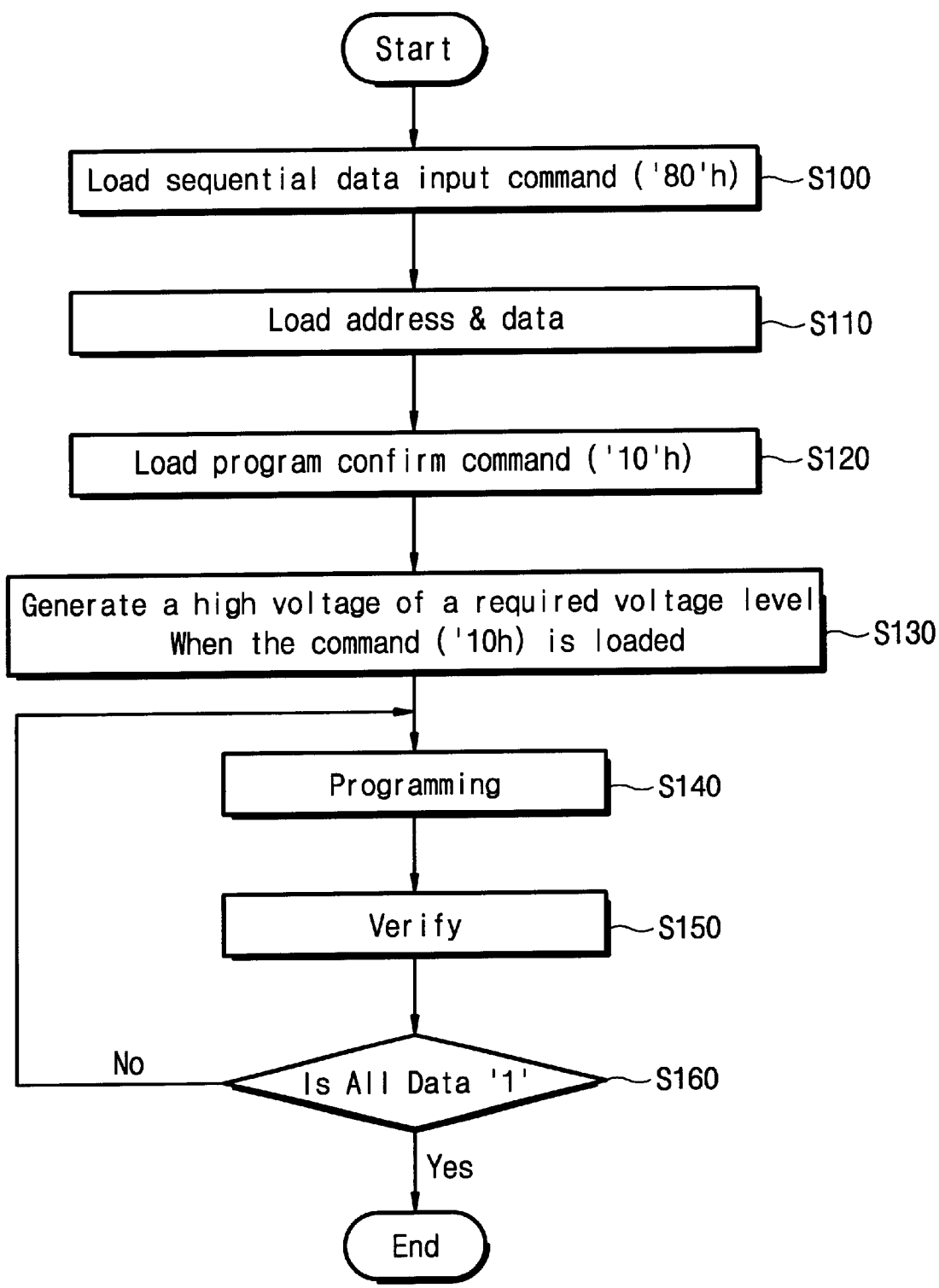
FIG. 3 is a, flow chart of the programming method of the present invention.
Figure 4:
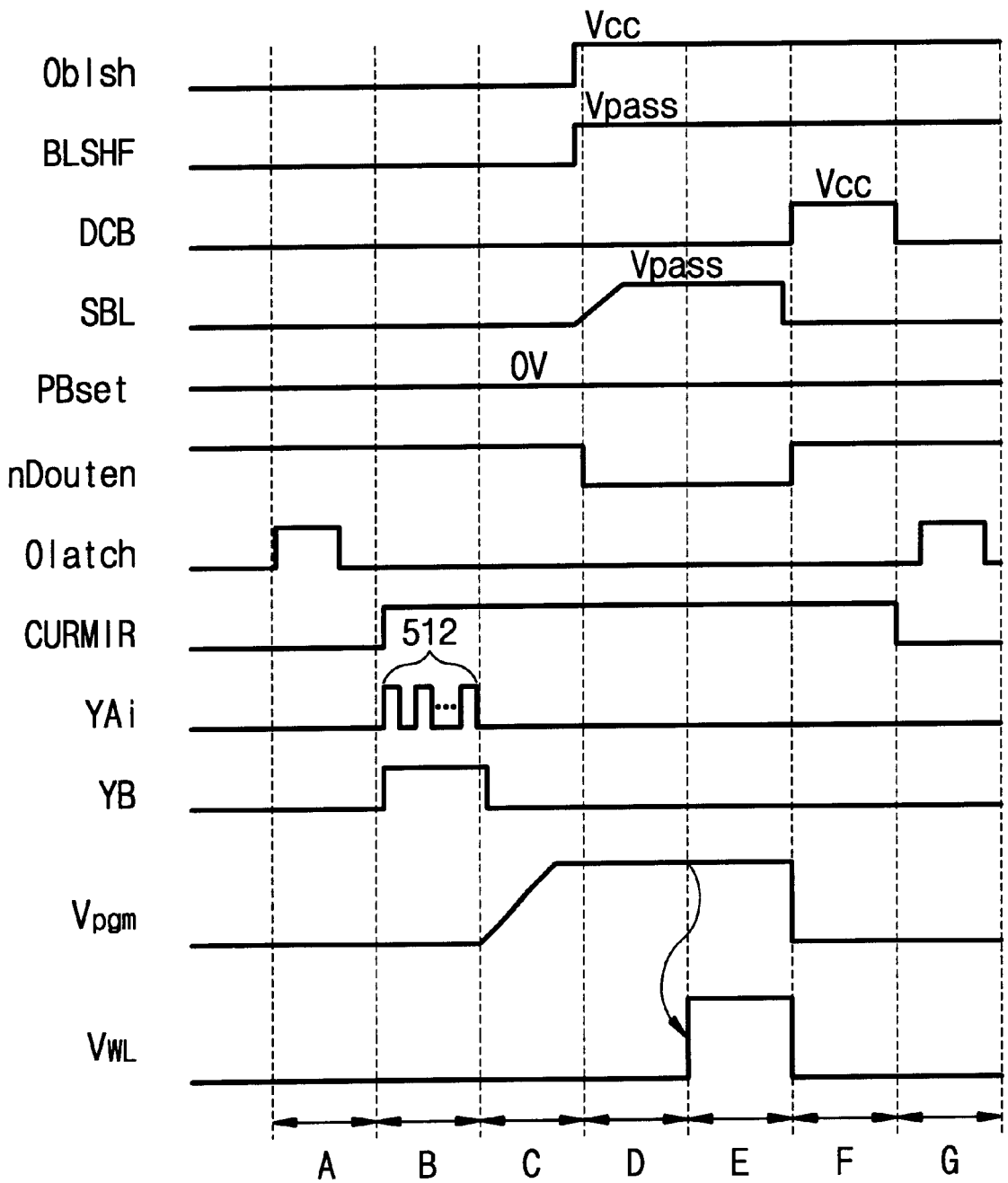
FIG. 4 is a timing diagram of the control signals used in the flash memory device shown in FIG. 1.

FIG. 3 is a flow chart showing a program procedure according to the present invention, and FIG. 4 is a diagram showing timing of control signals used in the flash memory device shown in FIG. 1. The memory cell array is first erased and then an erase verify operation is performed. After the erase operation is verified, the program operation of the present invention according to the program procedure shown in FIG. 3 is performed.

Referring to FIG. 3, at step S100, a command ('80'h) signal indicating sequential data input is loaded in the NAND-type flash memory device (e.g., a command register therein). At step S110, an address and data are loaded in the flash memory device. When the address is inputted therein, the page buffers 30_0 to 30_i (that is, the latch of each buffer) are initialized responsive to control signal generated from the controller 80. Step S110 corresponds to periods A and B of FIG. 4. During period A, the signal Olatch is maintained at a logic high level and the signals Oblsh, BLSHF, DCB, SBL and CURMIR are maintained at a logic low level. This signaling results in node N3 of each latch 50 being grounded to the ground voltage Vss through turned-on NMOS transistors M5 and M6. Doing so initializes the page buffers 30_0 to 30_i. During period B, data bits to be programmed are loaded in corresponding latches 50 of the page buffers 30_0 to 30_i through the column pass gate circuit 40 responsive to column select signals YA0 to YAi and YB. For example, data "1" is loaded in a latch 50 of a page buffer that corresponds to an EEPROM cell to be programmed, and data "0" is loaded in a latch of a page buffer that corresponds to an EEPROM cell to be program-inhibited.

At step S120, a command ('80'h) signal PC_CMD indicating a program confirm is provided to the NAND-type flash memory device. The high voltage generating circuit 60 of the memory device performs its pump operation in response to the program confirm command signal PC_CMD, and thus a high voltage $V_{PGM}$ from the circuit 60 reaches a required voltage level in predetermined time (e.g., 15 to 20 μs). The step S120 corresponds to a period C of FIG. 4, during which the controller 80 controls logic states of control signals used in the page buffer 30.

At step S140, EEPROM cells of a selected word line are programmed using a bit line setup operation and a program operation. The bit line setup operation is carried out during period D of FIG. 4, in which bit lines BL0 to BLi are charged with a power supply voltage Vcc (or a program inhibition voltage) or a ground voltage Vss (or a program voltage) according to data bits loaded in step S110. The program operation is performed during period E of FIG. 4, in which a high voltage $V_{PGM}$ generated from the high voltage generating circuit 60 is supplied to a word line selected by the row decoder circuit 20. An EEPROM cell transistor connected to a bit line, which is charged with the ground voltage Vss, is programmed because a bias condition sufficient to form F-N tunneling of a hot electron from a drain of the cell transistor to a floating gate thereof is satisfied. On the other hand, an EEPROM cell transistor connected to a bit line, which is charged with the power supply voltage Vcc, is program-inhibited.

In particular, since a bit line related to a program-inhibited cell transistor and a gate of a string select transistor SSTm related thereto have the power supply voltage, a source of the string select transistor SSTm is charged with Vcc-Vth (Vth indicates a threshold voltage of an NMOS transistor). However, once the source of the string select transistor SSTm reaches a potential of about Vcc-Vth, the string select transistor SSTm turns off. When the string select transistor SSTm turns off, source, drain and channel regions of each of EEPROM cell transistors in a string corresponding to the closed transistor SSTm are isolated from the bit line charged with the power supply voltage. These EEPROM cell transistors then enter a floating state. Furthermore, since source, drain and channel regions of respective EEPROM cell transistors, which correspond to a bit line driven with the program inhibition voltage, are capacitively connected to control gates thereof, the potential of the above-referenced regions is increased or boosted. No electric field is formed between a control gate (or a floating gate) and a channel region of each cell transistor due to the boosting effect. Therefore, there is no possibility of an unnecessary program that occurs when "hot" electrons are injected into floating gates of the cell transistors corresponding to the bit line with the program inhibition voltage.

A detailed description associated with the program inhibition method is disclosed in U.S. Pat. No. 5,677,873 entitled "METHOD OF PROGRAMMING FLASH EEPROM INTEGRATED CIRCUIT MEMORY DEVICES TO PREVENT INADVERTENT PROGRAMMING OF NONDESIGNATED NAND MEMORY CELLS THEREIN", which is hereby incorporated by reference.

Before step S150, the voltages applied to word lines and bit lines during the period E are discharged up to a ground voltage level during a recovery (or discharge) period F (refer to FIG. 4). At step S150, each programmed cell transistor is verified to ensure that it has a required target threshold voltage. The discharge operation is carried out in order to discharge an unnecessary program during a verify operation to be performed next. When a threshold voltage of an EEPROM cell transistor reaches a required target threshold voltage, the latch 50 (that is, the node N2) of a page buffer 30_m is set to a logic high level (that is, a program inhibition voltage) in a verify period F of FIG. 4. On the other hand, when the threshold voltage of the EEPROM cell transistor is lower than the required threshold voltage, the latch 50 of the page buffer continues to be maintained at a program voltage. If data "1" are not latched in all page buffers 50, the programming process (consists of a bit line setup operation, a program operation, a recovery operation and a verify operation) is repeated until data "1" is latched in the latch 50 of each page buffer. During the iterated programming process, a word line voltage is continuously increased. This increase in work line voltage is called "an incremental step pulse programming scheme". Herein, it is obvious to a person skilled in the art that the term "the programming process" corresponds to "a program loop".

According to the present invention, a program loop to be performed unnecessarily is reduced by obtaining a high voltage of a required level prior to performing a bit line setup operation. As the number of program loops is reduced, program time is shortened, and characteristic of EEPROM cell transistors is prevented from being dropped.

It should obvious to a person skilled in the art that the flash memory device in FIG. 1 according to the program algorithm of the present invention can be realized differently. For example, the NAND-type flash memory device can be realized so that whether a high voltage from the high voltage generating circuit 60 reaches a required voltage level is detected and the controller operates according to the detection result.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for programming a nonvolatile semiconductor memory device, the memory device including an array of electrically erasable and programmable read-only memory cells (EEPROM cells) arranged in a matrix of rows and columns and a page buffer circuit coupled to the array via the columns, the method comprising:

sequentially loading program data in the page buffer circuit responsive to a first command signal, the first command signal indicating program data input;

generating a program voltage responsive to a second command signal, the second command signal indicating programming initiation; and programming the EEPROM cells after the program voltage reaches a predetermined target voltage.

2. The method of claim 1 wherein programming includes:

charging the columns with either a program-inhibit voltage or a column program voltage depending on the program data;

supplying the program voltage to a selected row to thereby program the EEPROM cells on the selected row;

discharging the rows and columns after charging and supplying;

reading out data from the programmed EEPROM cells after discharging; and verifying that all of the programmed EEPROM cells are properly programmed;

repeating programming until all of the programmed EEPROM cells are verified as being properly programmed.

3. The method of claim 2 wherein the program voltage is increased in a stepwise manner when programming is repeated.

4. The method of claim 1 wherein the EEPROM cells are NAND type cells.

5. A method for programming a nonvolatile semiconductor memory device that includes an array of electrically erasable and programmable read-only memory cells (EEPROMs) arranged in a matrix of rows and columns and a page buffer circuit coupled to the array via the columns, the method comprising:

sequentially loading program data in the page buffer circuit responsive to a first command signal;

generating a row program voltage responsive to a second command signal, the second command signal indicating programming initiation;

delaying the second command signal by a predetermined time; and programming the EEPROMs responsive to the delayed second command signal.

6. The method of claim 5 wherein delaying the second command signal includes delaying the second command signal for a time necessary for the program voltage to reach a target voltage.

7. A method for programming a nonvolatile semiconductor memory device, the memory device including an array of electrically erasable and programmable read-only memory cells (EEPROMs) arranged in a matrix of rows and columns and a page buffer circuit coupled to the array via the columns, the method comprising:

sequentially loading program data in the page buffer circuit responsive to a first command signal;

generating a program voltage to be supplied to a selected row responsive to a second command signal;

detecting whether the program voltage reaches a target voltage and generating a detection signal as a result of the detecting; and programming the EEPROMs responsive to the detection signal.

* * * * *

UNITED STATES PATENT AND TRADEMARK OFFICE
CERTIFICATE OF CORRECTION

PATENT NO.    : 6,335,881 B2
DATED         : August 16, 2001
INVENTOR(S)   : Kim et al.

It is certified that error appears in the above-identified patent and that said Letters Patent is hereby corrected as shown below:

Column 2,
Line 31, "loops. with" should read -- loops. With --.

Column 3,
Line 3, "programming a a" should read -- programming a --.

Column 4,
Line 27, "should obvious" should read -- should be obvious --.

Signed and Sealed this

Twentieth Day of August, 2002

Attest:

JAMES E. ROGAN
Attesting Officer        Director of the United States Patent and Trademark Office